United States Patent [19]
Rostoker et al.

[11] Patent Number: 5,384,487
[45] Date of Patent: Jan. 24, 1995

[54] OFF-AXIS POWER BRANCHES FOR INTERIOR BOND PAD ARRANGEMENTS

[75] Inventors: Michael D. Rostoker, San Jose; Nicholas F. Pasch, Pacifica; Joe Zelayeta, Saratoga, all of Calif.

[73] Assignee: LSI Logic Corporation, Milpitas, Calif.

[21] Appl. No.: 58,120

[22] Filed: May 5, 1993

[51] Int. Cl.⁶ .................... H01L 23/48; H01L 29/44; H01L 29/52; H01L 29/60
[52] U.S. Cl. .................... 257/786; 257/692; 257/666
[58] Field of Search ............ 257/666, 673, 691, 692, 257/779, 780, 784, 786

[56] References Cited

U.S. PATENT DOCUMENTS

| | | | |
|---|---|---|---|
| 3,429,040 | 2/1969 | Miller | 29/626 |
| 3,811,186 | 5/1974 | Larnerd et al. | 29/626 |
| 3,871,014 | 3/1975 | King et al. | 357/67 |
| 3,984,860 | 10/1976 | Logue | 357/68 |
| 4,190,855 | 2/1980 | Inoue | 357/80 |
| 4,701,999 | 10/1987 | Palmer | 437/211 |
| 4,772,936 | 9/1988 | Reding et al. | 357/80 |
| 4,774,635 | 9/1988 | Greenberg et al. | 361/421 |
| 4,803,546 | 2/1989 | Sugimoto et al. | 357/81 |
| 4,825,284 | 4/1989 | Soga et al. | 357/80 |
| 4,894,704 | 1/1990 | Endo | 357/70 |
| 4,897,602 | 1/1990 | Lin et al. | 324/158 F |
| 4,926,241 | 5/1990 | Carey | 357/75 |
| 4,970,575 | 11/1990 | Soga | 357/72 |
| 5,051,813 | 9/1991 | Schneider et al. | 357/72 |
| 5,184,208 | 2/1993 | Sakuta et al. | 257/666 |
| 5,229,639 | 7/1993 | Hansen et al. | 287/666 |

FOREIGN PATENT DOCUMENTS 61-145838  7/1986  Japan ..................... 21/60

Primary Examiner—Andrew J. James
Assistant Examiner—S. V. Clark
Attorney, Agent, or Firm—Hongiman Miller Schwartz and Cohn

[57] ABSTRACT

A technique for improving power distribution to an semiconductor die while simultaneously reducing thermally-induced mechanical stresses on bond pads in semiconductor device assemblies is accomplished by providing the signal-carrying bond pads in a collinear arrangement along an axis of the die, and providing power-carrying bond pads in an off-axis location. The on-axis configuration of signal-carrying bond pads minimizes lateral thermal displacements of the bond pads relative to the axis, which minimizes any longitudinal, compressive end displacements of leadframe fingers or bond wires, thereby minimizing thermally induced mechanical stresses of the bond pad interfaces to the die. The positioning of the power-carrying bond pads off-axis reduces the length of internal (to the die) wiring required to connect circuitry on the die to the power-carrying bond pads. Constraining the location of the power-carrying bond pads to an interior area of the die approximately one half of the die area, and substantially centered about the axis, keeps longitudinal thermal displacements of the ends of leadframe fingers or bond wires connected to the power-carrying bond pads relatively small compared to those experienced in peripheral bond pad placement (at the die edges), and ensures shorter, more direct internal paths to circuitry on the die.

18 Claims, 1 Drawing Sheet

OFF-AXIS POWER BRANCHES FOR INTERIOR BOND PAD ARRANGEMENTS

TECHNICAL FIELD OF THE INVENTION

The invention relates to integrated circuit fabrication techniques, and more particularly to techniques for forming electrical connections with an integrated circuit die.

BACKGROUND OF THE INVENTION

As used herein, the term "semiconductor device" refers to a silicon chip or die containing circuitry, and the term "semi conductor device package" refers to the semi conductor device and associated packaging containing the chip, including leads such as for connecting to a socket or a circuit board, and internal connections, such as bond wires or solder bump (e.g., micro-bump) connections, of the chip to the leads.

In a typical modern semiconductor device package, a semiconductor die (device) is disposed within a package and is connected to conductive leads of the semiconductor device package (assembly) by means of bond wires or "solder bump" (micro-bump) connections. The connections to the semiconductor die are accomplished via metallic connection points or "bond pads" (I/O pads) disposed on a planar surface of the die, around the periphery (along the edges) thereof in a "peripheral area". The peripheral area is a ring-shaped area on the surface of the die, essentially a narrow band between the edges of the die and the "interior area" of the die. The conductive leads of the semiconductor device package may be provided by a leadframe, such as in a molded plastic or TAB (Tape Automated Bonding) semi conductor device package, or by printed traces, such as in a ceramic or overmolded printed circuit board package. The conductive leads approach the semiconductor die within the semi conductor device package in a generally radial pattern. They may also approach the die in parallel ranks, from one or more edges of the die.

Typically, a leadframe is stamped (or etched) from a sheet (foil) of conductive material, simultaneously forming all of the conductive leads of the leadframe. Often, the leadframe is held together by sacrificial "bridges" between the leads, which are removed after the leadframe is assembled to a die and a package body is formed. The leads are then effectively separate. However, by virtue of their common mounting within a package body, they continue to behave, in many respects, as a unit.

As the circuitry on a die operates, it dissipates power and heats up. Often, there is a mismatch between the thermal coefficients of expansion (TCE) of a semiconductor die and the leadframe (and package body) to which it is attached. This is especially troublesome where solder bump (micro-bump) connections are used to connect the die to the leadframe. (It is assumed that the heating of the die as it operates is fairly uniform). The die expands about its "centroid" (center of mass) as temperature rises, as do the leadframe and package body. However, the die expands at a different rate than the leadframe and package body, causing a great deal of mechanical stress at the interface between the leadframe and the bond pads (the solder bump connections). This stress creates a tendency of the bond pads to tear away from the die.

On any thermally expanding body, the further a point on the body is from the centroid, the greater the absolute distance it travels (displaces) during expansion. Since semiconductor dies are typically rectangularly shaped and the bond pads are typically disposed along the edges of the rectangular shape (in the peripheral area), the bond pads undergo a fairly large absolute displacement as compared to points located closer to the center of the die. Any bond pads located at the corners of the die, being furthest from the centroid, undergo the greatest displacement during thermal expansion. As a consequence of the absolute thermal displacements that any two different points undergo on the surface of the die, they undergo differential thermal displacements relative to one another. The further from one another that any two points on the surface of an expanding die are, the greater the differential thermal displacement between them. The leadframe and package body combination also expands about its centroid, albeit at a different rate. The center of expansion of the leadframe/package body combination is generally located fairly close to the centroid of the die, since the die is the heat source which causes the expansion. As a result, any differential thermal displacement causing mechanical stress at the bond pads of a semiconductor device is greatest at the corners of the die. The common practice of disposing bond pads along the edges of the die, therefore, would seem to create the worst possible circumstances from the point of view of thermal expansion.

Although the thermal expansion problem is most severe with micro-bump (solder bump) connections to a relatively rigid leadframe assembly, the same expansion characteristics apply to the die and leadframe/package body even if bond wires are used to connect the bond pads on the die to the leadframe. While bond wire connections are considerably more flexible and resilient than are solder bump connections, thermal flexing of bond wire connections can create long-term reliability problems.

One of the most significant reasons that bond pads are typically disposed about the edges (periphery) of a die is that the peripheral location of bond pads permits a relatively large number of connections to the die without causing connections (e.g., bond wires) to cross over one another. Current trends are towards providing smaller bond pads so that even greater numbers of I/O (and power) connections to the die may be accommodated. Unfortunately, these smaller bond pads are even more fragile than "ordinary" (larger) size bond pads, making such techniques even more prone to thermal stress problems.

Another problem with locating bond pads along the periphery of a die is that many of the connections are made to circuitry that lies well within the interior area of the die, requiring that the signals to and from that circuitry (and, in some cases, power to the circuitry) travel a relatively great distance within the die along the die's minute wiring structures (conductive lines) before they reach the bond pad connection. Hence, a "pad buffer" circuit is usually provided at or near a bond pad associated with an output signal to buffer the output signal at the bond pad. These factors can contribute to timing "skew", or differences in signal timing due to different wiring delays, particularly for very high speed circuits, which presents additional challenges to the circuit designer. The wiring structures (interconnections, or conductive lines) on the die are extremely small and exhibit relatively high (i.e., non-trivial) resistance. Even a tiny bond wire is a massive conductor compared to the relatively tiny interconnection lines on a die.

Power distribution to the chip is also hampered to some degree by the location of bond pads in the peripheral area. Circuits located close to the centerline (centrally located circuits) of the die receive power from the pads at the periphery of the die, usually along a branched "bus" structure formed in the wiring layers of the die. Power is distributed to other circuits between the pads and the centrally located circuits before it reaches the center of the die. While the power "bus" structure is typically routed in a fairly direct fashion, some branches of the power distribution bus can become fairly tortuous in reaching certain circuits. Many circuits located within the interior area of the die, particularly centrally located circuits, may receive power along a wiring path the length of which is greater than one half of the distance across the die. As a result, line losses and electrical noise problems may be experienced by those circuits which are most distant from the power distribution (bond) pads, particularly the centrally located circuits.

In order to minimize such line losses and electrical noise, it is common practice to provide multiple bond pads distributed about the periphery of the die for each power supply voltage. However, this does not solve the problem of the length of the power distribution path in the internal wiring layers of a die required to reach centrally located circuits.

Attention is directed to the following U.S. Patents, incorporated herein by reference, and of general interest with respect to leadframe-type semi conductor device packages and methods for manufacture thereof: U.S. Pat. No. 4,701,999 issued Oct. 27, 1987 to Palmer, U.S. Pat. No. 4,774,635 issued Sep. 27, 1988 to Greenberg et al., U.S. Pat. No. 4,894,704 issued Jan. 16, 1990 to Endo, U.S. Pat. No. 4,897,602 issued Jan. 30, 1990 to Lin et al., and U.S. Pat. No. 5,051,813 issued Sep. 24, 1991 to Schneider et al.

Attention is further directed to the following U.S. Patents, incorporated herein by reference, and of general interest with respect to micro-bump (e.g., solder bump) bonding: U.S. Pat. No. 3,429,040 issued Feb. 25, 1969 to Miller, U.S. Pat. No. 3,811,186 issued May 21, 1974 to Larnerd et al., U.S. Pat. No. 3,871,014 issued Mar. 11, 1975 to King et al., U.S. Pat. No. 3,984,860 issued Oct. 5, 1976 to Logue, U.S. Pat. No. 4,190,855 issued Feb. 26, 1980 to Inoue, U.S. Pat. No. 4,772,936 issued Sep. 20, 1988 to Reding et al., U.S. Pat. No. 4,803,546 issued Feb. 7, 1989 to Sugimoto et al., U.S. Pat. No. 4,825,284 issued Apr. 25, 1989 to Soga et al., U.S. Pat. No. 4,926,241 issued May 15, 1990 to Carey, and U.S. Pat. No. 4,970,575 issued Nov. 13, 1990 to Soga et al.

Other information relating to microbump bonding techniques may be found in Japanese Patent number 61-145838A issued on Jul. 3, 1986 to Kishio Yokouchi, and in "LED Array Modules by New Technology Microbump Bonding Method," by Hatada, Fujimoto, Ochi, and Ishida, IEEE Trans. Comp., Hybrids, and Manuf. Tech., Volume 13 no. 3, Sep. 1990, incorporated by reference herein.

DISCLOSURE OF THE INVENTION

It is therefore an object of the present invention to provide an improved technique for distributing power to circuits of (circuitry within) a die.

It is a further object of the present invention to provide a technique for shortening the maximum length of power distribution wiring paths (conductive lines, in the die) to circuits on a semi conductor die.

It is a further object of the present invention to provide a technique for minimizing line losses in distributing power to various circuit elements in a semiconductor (integrated circuit) die.

It is a further object of the present invention to provide a technique for minimizing electrical noise resulting from power distribution to a semiconductor die, by providing a technique that more directly supplies power to the circuitry on a die via substantially direct (non-tortuous) paths.

It is a further object of the present invention to accomplish the foregoing objects in the context of both bond wire and micro-bump connections to semiconductor dies.

It is a further object of the present invention to accomplish the foregoing objects in the context of minimizing thermally created stresses at bond pad interfaces to semiconductor dies.

Hereinafter, the planar surface area of a semiconductor die in the immediate vicinity of the edges of the die will be referred to as the "peripheral area", and bond pads disposed in this peripheral area will be referred to as "peripheral bond pads". Also, the planar surface area of the die located inside of (surrounded by) the peripheral area will be referred to as the "interior area" of the die, and bond pads disposed within the "interior area" will be referred to as "interior bond pads".

According to the invention, it is posited that differential thermal displacements between points on a body due to thermal expansion of the body are proportional to the distance between the points. It is further posited that the absolute thermal displacement of a point on a body relative to the thermal center of expansion is proportional to the distance between the point and the thermal center of expansion. Also, if two bodies have different thermal coefficients of expansion and are thermally coupled at a point near their respective centroids, then differential thermal displacement and absolute thermal displacements between points on the different bodies will behave similarly.

It is further posited that leadframe fingers and/or bond wires are considerably stiffer relative to end displacement in a longitudinal direction (along their length) than to end displacement in a lateral direction (perpendicular to their length). Therefore, lateral thermal displacements of the ends of bond wires or leadframe fingers due to differential expansion create less mechanical stress on bond pad interfaces than do longitudinal thermal displacements. Accordingly, the present invention seeks to place signal-carrying bond pads along an "axis" of a semiconductor die. The "axis" is an imaginary line which passes over (or near) the centroid (center of mass and/or center of thermal expansion) of the die. Since the axis lies over the centroid of the die, bond pads placed along the axis experience only longitudinal displacement (along the axis), and little or no lateral thermal displacement (away from the axis). On-axis bond pads do, however, displace thermally along the length (longitudinally along) the axis. Since bond wires and/or leadframe fingers will approach the bond pads from a direction substantially perpendicular to the axis, this longitudinal thermal displacement of bond pads along the axis translates to lateral end displacement of the bond wires and/or leadframe fingers. Since lateral displacement of the bond pads relative to the axis is minimal, longitudinal end displacements of the leadframe fingers and/or bond wires are correspondingly small. In this manner, by orienting the bond pads along a line substantially perpendicular to the leadframe fingers (or bond wires), problems associated with thermally-induced migration of the bond pads can be minimized.

According to a feature of the invention, in order to better distribute power to the semiconductor die, power-carrying bond pads are disposed in an off-axis configuration in an area centered about the axis (centerline) equal to about one half of the total die area.

In one embodiment of the invention, a semiconductor device with off-axis interior bond pads for power distribution comprises a semiconductor die, circuitry formed within the die, a first plurality of bond pads disposed on the die in a linear configuration along an axis of the die, and a second plurality of bond pads disposed on the die, within an interior area of the die and spaced away from the axis (e.g., centerline). Signal connections (to a leadframe or to bond wires) are formed between the first plurality of bond pads and the circuitry, and power connections (to a lead frame or to bond wires) are formed between the second plurality of bond pads and the circuitry.

According to one aspect of the invention, a first limit line and a second limit line are defined on the surface of the die, located on opposite sides of the axis, parallel to the axis and located a distance from the axis equal to one-quarter of the width of the die. A placement area is defined on the surface of the die between the first limit line and the second limit line. The second plurality of bond pads is disposed entirely within the placement area.

According to another aspect of the invention, at least two of the bond pads in the second plurality of bond pads are disposed in a collinear arrangement, on opposite sides of the axis, along a line perpendicular to the axis.

According to another aspect of the invention, at least two of the bond pads in the second plurality of bond pads are disposed in a collinear arrangement, on a common side of the axis, along a line perpendicular to the axis.

Other embodiments of the invention are directed to forming the semi conductor device arrangements described above.

Both the first (signal-carrying) and the second (power-distributing) pluralities of bond pads are preferably "interior" bond pads, located in an interior (non-peripheral) area of the die.

Further, according to the invention, if circuits on a semiconductor die are located distant from the desired "interior" bond pad locations, that existing and/or extra wiring (metallization) layers may be employed to provide connection between these circuits and bond pads at the desired locations. This is particularly useful in applying the present inventive technique to semiconductor dies which were originally laid out for bond pads in the peripheral area. Existing and/or additional wiring layers may be employed to route signals from the original (designed) bond pad positions to the new (desired, according to the inventive technique) interior bond pad positions.

Other objects, features and advantages of the invention will become apparent in light of the following description thereof.

DETAILED DESCRIPTION OF THE INVENTION

Figure 1:
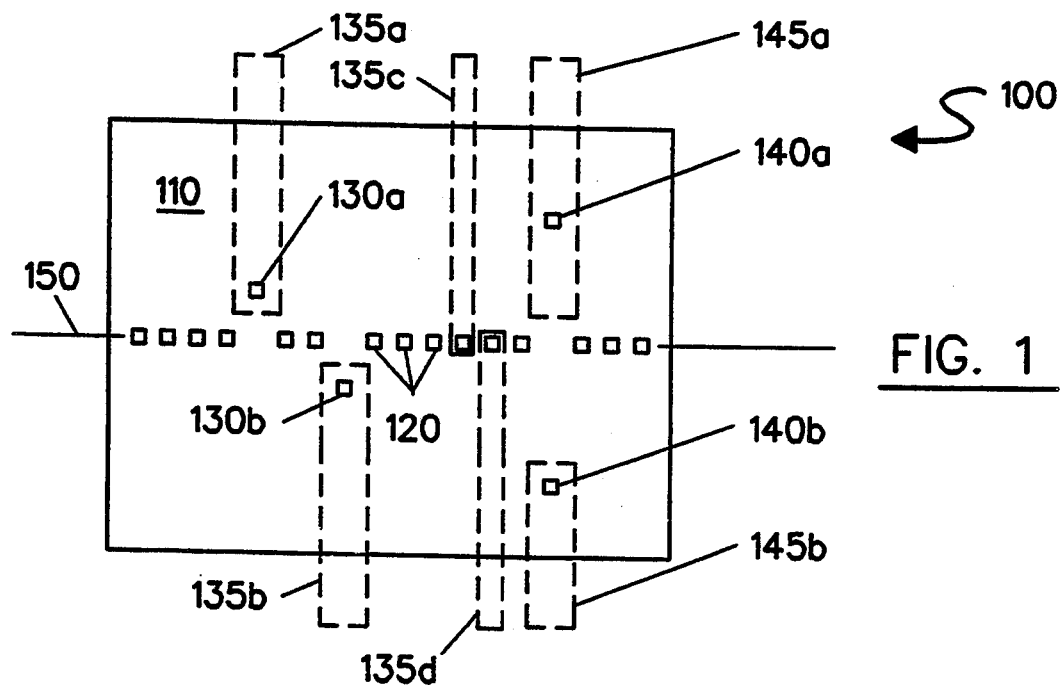
FIG. 1 is a top view of a semiconductor die with an off-axis bond pad pattern for power distribution, according to the present invention.

According to the invention, it is posited that if an array of bond pads on a semiconductor die is tightly (closely) grouped (arranged or clustered), then the amount of differential thermal expansion between those bond pads will be correspondingly small, and that if such a small array of bond pads is located close to the centroid of the die, then the absolute thermal displacement of the bond pads will be correspondingly small.

Similarly, if the ends of the conductive leads of a leadframe (or bond wires) connecting to the die form a small pattern, the differential thermal displacement of the ends of the leads will be correspondingly small. Also, if the small pattern formed by the ends of the conductive leads is located close to the center of expansion of the leadframe, then the absolute thermal displacement of the ends of the conductive leads will be correspondingly small. According to the invention, these principles may be used to great advantage in the packaging of semi conductor dies.

While the industry trend is largely towards increasing the number of connections to a semiconductor die, certain types of semiconductor devices, despite great complexity, do not require large numbers of I/O connections. One example of this type of semiconductor device is any type of memory device (e.g., ROMs, RAMs, including dynamic RAM and static RAM, etc.) Memory devices are highly repetitive arrays of circuitry with a relatively small number of I/O connections thereto. In cases such as these, there is no need to use the large bond pad capacity of the periphery of the die. In fact, according to the invention, it is extremely advantageous (from a thermal expansion point of view) to locate the bond pads in a relatively small array, preferably, but not necessarily, towards the centroid of the die.

Leadframe fingers and, to a lesser degree, bond wires are stiffest (most rigid and unbending) along their length, since any displacement of the end of the leadframe finger or bond wire tends to put it in compression. Although bond wires are considerably more tolerant of any kind of end displacement than are leadframe fingers, the path of bond wires is typically kept fairly flat (no significant "loft" or high arc in the path of the bond wire), resulting in a certain amount of stiffness along the length of the bond wires (longitudinally) because of the tendency of end motion in a flat configuration to put the bond wire in compression until an arc is formed. This flat bond wire configuration is used to minimize to possible of short-circuits between adjacent bond wires. However, bond wires and leadframe fingers are both considerably more tolerant of lateral displacement of their ends since the lateral displacement is distributed along the entire length of the leadframe finger or bond wire (i.e., there is some sideways "springiness" of bond wires and leadframe fingers). Accordingly, then, a linear bond pad arrangement along a longitudinally oriented centerline of a semiconductor die with bond wires or leadframe fingers approaching from the sides takes greatest advantage of this feature. That is, an arrangement of bond pads in a straight line along a path through (or over) the centroid of a semiconductor die will experience little or no lateral (relative to the line of bond pads, longitudinal relative to the bond wires or leadframe fingers) thermal displacement of bond pads.

Unfortunately, such a solely linear arrangement of bond pads provides little or no improvement in power distribution, since the distance from a "centerline" bond pad to the most distant circuits can still be on the order of one half of the distance across the die.

According to the invention, bond pads for signal connections are disposed in an interior area of the die along a line approximately through (over) the centroid of the die, to minimize lateral thermal displacement (relative to the line). This line through the centroid is an "axis" of the die, and the linear configuration of bond pads along the "axis" is an "on-axis" bond pad configuration. Additional bond pads for power supply connections are disposed in the interior area of the die in an "off-axis" location (i.e., off of the centerline). These bond pads are kept within the approximately half of the area of the die which is distributed about the centerline (i.e., their distance from the axis is no greater than one quarter of the distance across the die as measured perpendicular to the axis).

By positioning the power distribution pads off-axis, the maximum distance of power wiring paths is reduced by as much as half. With this reduction in power wiring length (within the die) comes a resultant reduction in line losses and in power-induced electrical noise. Further, by constraining the locations of the bond pads to one half of the die area distributed about the centerline (an "inner" half of the die area), lateral thermal displacements of bond pads (relative to the axis, longitudinal relative to the leadframe fingers or bond wires) are less than half of those experienced in peripheral bond pad configurations, creating considerably less thermally induces stresses on the bond pads.

FIG. 2 is a top view of a semi conductor die 100 having an "interior" bond pad arrangement, according to the invention. A plurality of "signal" bond pads 120 (sixteen shown) are disposed on a planar surface 110 of the die 100 along an axis 150 of the die 100. The axis 150 is preferably centered on the die. "Power" bond pads 130a, 130b, 140a, and 140b, are disposed in an off-axis location relative to the signal bond pads 120. Typical leadframe finger positions 135a, 135b, 145, for leadframe fingers connecting to the power bond pads are indicated with dashed lines. Power bond pads 130a and 130b are located off-axis (off of the centerline or axis 150), on opposite sides of the centerline (axis) 150 and are non-collinear but are positioned fairly close to the centerline 150. Power bond pads 140a and 140b are located off-axis, approximately halfway between the centerline 150 and the edges of the die 100, are on opposite sides of the centerline 150, and are collinear (along a line perpendicular to the centerline).

A first leadframe finger 135a is shown as a dashed line approaching the die 100 from one side of the centerline and extending over the surface 110 of the die 100 and over power bond pad 130a. A second leadframe finger 135b, also shown as a dashed line, approaches from the opposite side of the centerline 150, and extends over the surface 110 of the die 100 and over the power bond pad 130b. Typically, micro-bump connections are formed between the bond pads 130a and 130b and the leadframe fingers 135a and 135b, respectively.

A single leadframe finger 145 (also shown as a dashed line), approaching the die 100 from one side of the centerline 150, extends over the surface 110 of the die 100 and over both power bond pads 140a and 140b. Micro-bump connections are formed between both power bond pads 140a and 140b and the single leadframe finger 145.

The leadframe fingers 135a, 135b and 145 described with respect to FIG. 1 are for carrying power to the die. Hence, they connect to the power-distributing, off-axis bond pads 130a, 130b and 140a/b, respectively.

Not shown in FIG. 1 are additional leadframe fingers which connect to the signal-carrying bond pads 120. Such additional leadframe fingers would enter the surface of the die parallel to the power-carrying leadframe fingers 135a, 135b, 145, from one or both sides of the die (top or bottom as viewed in the Figure). These additional signal-carrying leadframe fingers are omitted from the figure for illustrative clarity. However, it is evident that the off-axis power bond pads (130a, 130b and 140a/b) must be disposed at longitudinal (with respect to the axis 150) positions whereat there are no signal-carrying bond pads 120. Hence, as shown in FIG. 1, there are discontinuities in the array of signal-carrying bond pads 120 along the axis 150—"blank" (no pad) positions corresponding to the longitudinal coordinates of the laterally offset power bond pads. No power bond pad is collinear (longitudinal coordinate the same) as any signal bond pad. However, the two (pair of) power bond pads 140a and 140b occupy the same longitudinal coordinate (and are on opposite sides of the axis).

FIG. 1 also illustrates that there are leadframe fingers (one shown, can be more) 135c extending from one edge (top, as viewed) of the die to a portion of the signal-carrying bond pads 120, and that there are leadframe fingers (one shown, can be more) 135d extending from an opposite edge (bottom, as viewed) of the die to another portion of the signal-carrying bond pads 120. This dedication of certain leadframe fingers for signals (and for connection to signal pads 120) and other leadframe fingers for power (and for connection to power pads, e.g., 130a, 130b, 140a, 140b) is also applicable to the embodiment shown in FIG. 2a.

Figure 2A:
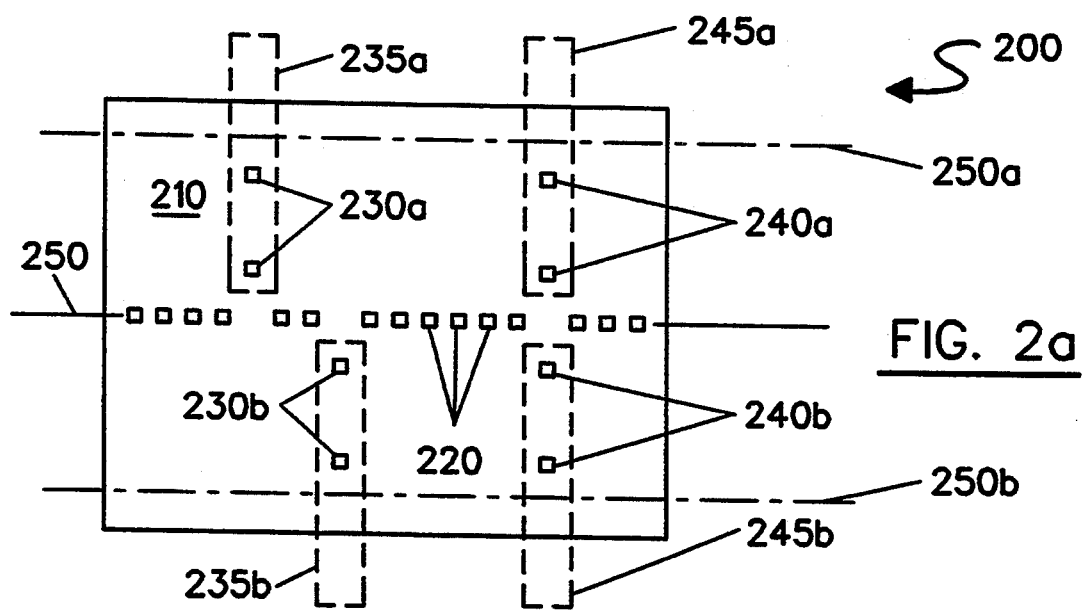
FIG. 2a is a top view of a semiconductor die with a compound off-axis bond pad pattern for power distribution, according to an alternate embodiment of the invention.

FIG. 2A is a top view of a semi conductor die 200 having an arrangement of interior bond pads similar to that of FIG. 1, but this time employing a "compound" off-axis power bond pad arrangement. (A "compound" off-axis bond pad arrangement is one where two or more bond pads are disposed in a collinear arrangement along a line perpendicular to the centerline of a die on one side of the centerline, or axis.) A plurality of "signal" bond pads 220 (sixteen shown, similar to those 120 of FIG. 1) are disposed on a planar surface 210 of the die 200 along an axis 250 of the die 200. Compound (pairs of) power bond pads 230a, 230b, 240a, and 240b, are disposed in an off-axis location relative to the signal bond pads 220 (and at longitudinal coordinates corresponding to 'missing' bond pads 220, as was the case in FIG. 1). Typical leadframe finger positions are indicated with dashed lines. A first pair of compound power bond pads 230a is located in collinear off-axis arrangement perpendicular to the centerline 250 on one side of the centerline. A second pair of compound power bond pads 130b is located in a collinear off-axis arrangement, on the opposite side of the centerline (axis) 250 and is non-collinear with the first pair 230a. Two pairs of compound power bond pads 240a and 240b are located in a collinear off-axis configuration on opposite sides of the centerline 250.

A first leadframe finger 235a (shown as a dashed line) approaches the die 200 from one side of the centerline (the same side of the centerline as the bond pads 230a) and extends over the surface 210 of the die 200 and over both compound power bond pads 230a. The leadframe finger 235a is connected (by microbumps, or the like) to both of the bond pads 230a.

Figure 2B:
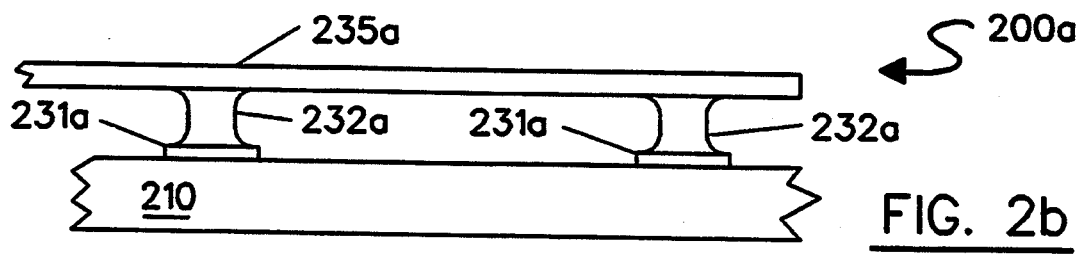
FIG. 2b is a side view of a leadframe finger connection to an off-axis compound pair of bond pads, according to the invention.

FIG. 2B shows the connection of the leadframe finger 235a to the pair of bond pads 230a (designated 231a in this figure), including raised features 232a of the connection effected between the leadframe finger and the bond pad. This type of connection is exemplary, and is also applicable to the arrangements of FIG. 1.

A second leadframe finger 235b (also shown as a dashed line) approaches from the opposite side of the centerline 250, and extends over the surface 210 of the die 200 and over both compound power bond pad 230b. The leadframe finger 235b is connected (by microbumps, or the like) to both of the pair of compound bond pads 230b.

Notably, with regard to the bond pads 230b and leadframe finger 235b connecting to the pads, the bond pads 230b are disposed at an axial (longitudinal) position that is coincident with a one of the bond pads 220, which bond pad 220 would be connected to by a lead frame finger (not shown) entering the die from the opposite side of the axis. In the other cases shown (e.g., 230a, 240a, 240b, 130a, 130b, 140a, 140b), the off-axis power bond pads are disposed at longitudinal positions whereat there is an absence of a signal bond pad (120, 220) in the linear signal bond pad array.

A third leadframe finger 245a extends from one side of the die, across the surface of the die, over (and connects to) the pair of compound bond pads 240a, which are on the same side of the centerline 250. A fourth leadframe finger 245b extends from an opposite side of the die, across the surface of the die, over (and connects to) the pair of compound bond pads 240b, which are on the same side of the centerline. The leadframe fingers 245a and 245b enter the die from opposite sides of the centerline 250, across the surface 210 of the die 200 and over the compound bond pads 240a and 240b, respectively. In this case, the pair of compound bond pads 240a are not only collinear with one another, but are also collinear with the pair of bond pads 240b, and both pairs 240a and 240b are located at longitudinal positions whereat there is no signal bond pad 220.

As illustrated in FIG. 2a, all of the power bond pads are disposed within and area between two outer limit lines 250a and 250b. These limit lines 250a and 250b indicate a constraint on the location of the power bond pads to a fractional (e.g., one half) area of the die that is preferably centered about the centerline 250. The limit lines 250a and 250b are positioned approximately halfway between the centerline and the edge of the die 200, on opposite sides of the centerline. That is, they are positioned parallel to the centerline 250 and are a distance away from the centerline 250 equal to approximately one-quarter (25%) of the distance across the die, as measured perpendicular to the centerline 250. By observing the constraints imposed by the limit lines 250a and 250b, it can be ensured that the conductive paths within the die, from a power bond pad to a given circuit element, can be minimized. This is in marked contrast to the sometimes rather long, tortuous paths required to be taken by conductive lines in the die when connecting to power bond pads disposed about the periphery of the die. Further, as noted hereinabove, by locating all of the bond pads within a central (interior) area of the die, the undesirable effects of thermally-induced bond pad migration can be minimized, which will alleviate stress-related failures (e.g., relatively immobile lead fingers pulling out bond pads).

In the embodiments shown and described hereinabove with respect to FIG. 1, 2a and 2b, while circuitry on the die is not shown to avoid illustrative clutter, and the additional lead fingers connecting to the signal-carrying bond pads (120, 220) are omitted, it will be readily apparent to one of ordinary skill in the art that signal connections are formed in wiring layers of the die between the on-axis (signal) bond pads and the circuitry, and that power connections are formed in wiring layers of the die between the off-axis (power) bond pads and the circuitry, It will also be readily apparent to one of ordinary skill in the art that the present inventive techniques are also applicable to bond wire connections to the bond pads.

Connections between circuits in the die and bond pads on the die may be accomplished by means of either existing or additional wiring layers, either within the die (under the surface of the die) or on the surface of the die. This is particularly advantageous in circumstances where either:

a) the design of the circuitry on the die was optimized for bond pad placement at the periphery of the die, and rerouting of existing signal (or power) lines is necessary to apply the present inventive techniques; or b) the circuitry on the die cannot be laid out optimally for the desired interior bond pad locations and it is necessary to route signals to bond pads from relatively distant positions on the die.

It is within the spirit and scope of the present invention that any of the techniques described hereinabove may be used in combination. For example, single and compound power bond pads may be mixed on a single die. In other words, there may be, on a given die, some combination of the various embodiments shown in FIGS. 1 and 2.

Further, the inventive techniques may be applied to raised bump mounting to printed traces on substrates, such as printed circuit board (e.g., FR4, BT resin, etc.) substrates, in a flip-chip configuration. Such printed circuit boards often have a thermal coefficient of expansion significantly different from that of silicon. Evidently, interior bond pads can be used to great advantage in such configurations.

By segregating the power bond pads (e.g., 130a) from the signal bond pads (e.g., 120), overall bond pad layout can be optimized for signal delay and noise, as well as for minimizing thermally-induced bond pad tearout problems.

What is claimed is:

1. A semiconductor device comprising:

a semiconductor die having a planar surface, a centroid, a peripheral area, an interior area within the peripheral area, an axis defined on the planar surface of the semiconductor die which passes substantially over the centroid, and a width perpendicular to the axis;

circuitry formed within the die;

a first plurality of relatively many bond pads disposed on the planar surface of the die in a linear configuration along the axis;

a second plurality of relatively few bond pads disposed on the planar surface of the die, within the interior area and spaced away from the centerline, the second plurality of bond pads being disposed on either side of the first plurality of bond pads; and further comprising:

a first limit line defined on the surface of the die to one side of the axis, parallel to the axis and located a first distance from the axis equal to approximately one-quarter of the width of the die;

a second limit line defined on the surface of the die to an opposite side of the axis, parallel to the axis and located a second distance from the axis equal to approximately one-quarter of the width of the die; and a placement area on the surface of the die between the first limit line and the second limit line;

wherein:

the second plurality of bond pads is disposed entirely within the placement area.

2. A semiconductor device, according to claim 1, wherein:

the first bond pads are disposed at selected first longitudinal positions along the axis;

the second bond pads are disposed at selected second longitudinal positions, offset from the axis; and at least a portion of the selected second longitudinal positions are distinct from the selected first longitudinal positions.

3. A semiconductor device, according to claim 1, wherein:

the first bond pads are disposed at selected first longitudinal positions along the axis;

the second bond pads are disposed at selected second longitudinal positions, offset from the axis; and at least a portion of the selected second longitudinal positions are coincident with a portion of the selected first longitudinal positions.

4. A semiconductor device, according to claim 1, further comprising:

the first plurality of bond pads carry signals to and from circuit elements formed within the die.

5. A semiconductor device, according to claim 1, wherein:

the second plurality of bond pads carry power to and from circuit elements formed within the die.

6. A semiconductor device, according to claim 6, wherein:

at least two bond pads in the second plurality of bond pads are disposed in a collinear arrangement, on opposite sides of the axis, along a line perpendicular to the axis.

7. A semiconductor device comprising:

a semiconductor die having a planar surface, a centroid, a peripheral area, an interior area within the peripheral area, an axis defined on the planar surface of the semiconductor die which passes substantially over the centroid, and a width perpendicular to the axis;

circuitry formed within the die;

a first plurality of relatively many bond pads disposed on the planar surface of the die in a linear configuration along the axis; and a second plurality of relatively few bond pads disposed on the planar surface of the die, within the interior area and spaced away from the centerline, the second plurality of bond pads being disposed on either side of the first plurality of bond pads;

wherein:

at least two bond pads in the second plurality of bond pads are disposed in a collinear arrangement, on opposite sides of the axis, along a line perpendicular to the axis; and further comprising:

a first limit line defined on the surface of the die to one side of the axis, parallel to the axis and located a first distance from the axis equal to approximately one-quarter of the width of the die;

a second limit line defined on the surface of the die to an opposite side of the axis, parallel to the axis and located a second distance from the axis equal to approximately one-quarter of the width of the die; and a placement area on the surface of the die between the first limit line and the second limit line;

wherein:

the second plurality of bond pads is disposed entirely within the placement area.

8. A semiconductor device, according to claim 1, wherein:

at least two of the bond pads in the second plurality of bond pads are disposed in a collinear arrangement, on a common side of the axis, along a line perpendicular to the axis.

9. A semiconductor device comprising:

a semiconductor die having a planar surface, a centroid, a peripheral area, an interior area within the peripheral area, an axis defined on the planar surface of the semiconductor die which passes substantially over the centroid, and a width perpendicular to the axis;

circuitry formed within the die;

a first plurality of relatively many bond pads disposed on the planar surface of the die in a linear configuration along the axis;

a second plurality of relatively few bond pads disposed on the planar surface of the die, within the interior area and spaced away from the centerline, the second plurality of bond pads being disposed on either side of the first plurality of bond pads; and wherein:

at least two of the bond pads in the second plurality of bond pads are disposed in a collinear arrangement, on a common side of the axis, along a line perpendicular to the axis; and further comprising:

a first limit line defined on the surface of the die to one side of the axis, parallel to the axis and located a first distance from the axis equal to approximately one-quarter of the width of the die;

a second limit line defined on the surface of the die to an opposite side of the axis, parallel to the axis and located a second distance from the axis equal to approximately one-quarter of the width of the die; and a placement area on the surface of the die between the first limit line and the second limit line;

wherein:

the second plurality of bond pads is disposed entirely within the placement area.

10. A semiconductor device assembly comprising:

a semiconductor die having a planar surface, four edges, a centroid, a peripheral area, an interior area within the peripheral area, an axis defined on the planar surface of the semiconductor die which passes substantially over the centroid, and a width perpendicular to the axis;

circuitry formed within the die;

a first plurality of bond pads disposed on the planar surface of the die in a linear configuration along the axis;

a second plurality of bond pads disposed on the planar surface of the die, within the interior area and spaced away from the centerline; and a leadframe having a first, a second, a third and a fourth pluralities of conductive fingers, wherein:

the first plurality of conductive fingers extend from a one edge of the die to a first portion of the first plurality of bond pads;

the second plurality of conductive fingers extend from an opposite edge of the die to a first portion of the first plurality of bond pads;

the third plurality of conductive fingers extend from the one edge of the die to a first portion of the second plurality of bond pads; and the fourth plurality of conductive fingers extend from the opposite edge of the die to a first portion of the second plurality of bond pads.

11. A semiconductor device assembly, according to claim 10, wherein:

at least two bond pads in the second plurality of bond pads are disposed in a collinear arrangement, on opposite sides of the axis, along a line perpendicular to the axis; and at least one of the third plurality of conductive fingers is connected to the at least two collinear bond pads in the second plurality of bond pads.

12. A semiconductor device assembly, according to claim 10, wherein:

at least two bond pads in the second plurality of bond pads are disposed in a collinear arrangement, on a common side of the axis, along a line perpendicular to the axis; and at least one of the third plurality of conductive fingers is connected to the at least two collinear bond pads in the second plurality of bond pads.

13. A semiconductor device, according to claim 1, wherein:

the bond pads of the first and second plurality of bond pads are of the type suitable for making solder-bump type connections to conductive fingers of a leadframe.

14. A semiconductor device assembly, according to claim 10, wherein:

the bond pads of the first and second plurality of bond pads are connected to the respective pluralities of conductive fingers by solder-bump type connections.

15. A semiconductor device assembly, according to claim 10, wherein:

the first bond pads are disposed at selected first longitudinal positions along the axis;

the second bond pads are disposed at selected second longitudinal positions, offset from the axis; and at least a portion of the selected second longitudinal positions are distinct from the selected first longitudinal positions.

16. A semiconductor device assembly according to claim 10, wherein:

the first bond pads are disposed at selected first longitudinal positions along the axis;

the second bond pads are disposed at selected second longitudinal positions, offset from the axis; and at least a portion of the selected second longitudinal positions are coincident with a portion of the selected first longitudinal positions.

17. A semiconductor device assembly, according to claim 10, further comprising:

a first limit line defined on the surface of the die to one side of the axis, parallel to the axis and located a first distance from the axis equal to approximately one-quarter of the width of the die;

a second limit line defined on the surface of the die to an opposite side of the axis, parallel to the axis and located a second distance from the axis equal to approximately one-quarter of the width of the die; and a placement area on the surface of the die between the first limit line and the second limit line;

wherein:

the second plurality of bond pads is disposed entirely within the placement area.

18. A semiconductor device assembly, according to claim 10, wherein:

at least two of the bond pads in the second plurality of bond pads are disposed in a collinear arrangement, on a common side of the axis, along a line perpendicular to the axis.

* * * * *